United States Patent [19]
Edwards

[11] Patent Number: 5,130,883
[45] Date of Patent: Jul. 14, 1992

[54] CIRCUIT FOR OVERVOLTAGE PROTECTION

[75] Inventor: Arthur J. Edwards, Hoffman Estates, Ill.

[73] Assignee: Motorola, Inc., Schaumburg, Ill.

[21] Appl. No.: 484,313

[22] Filed: Feb. 26, 1990

[51] Int. Cl.$^5$ .............................................. H02H 9/02
[52] U.S. Cl. .................................... 361/91; 361/18; 307/64
[58] Field of Search ............... 361/91, 56, 111, 18, 361/60, 75; 307/64

[56] References Cited

U.S. PATENT DOCUMENTS

| | | | |
|---|---|---|---|
| 3,609,504 | 9/1971 | Barker et al. | 320/7 |
| 3,746,962 | 7/1973 | Wright | 320/61 |
| 3,801,895 | 4/1974 | Kanngiesser | 321/27 R |
| 4,495,536 | 1/1985 | Bynum | 361/91 |
| 4,679,112 | 7/1987 | Craig | 361/33 |
| 4,703,388 | 10/1987 | Ruhnau | 361/91 |
| 4,787,008 | 11/1988 | Graff et al. | 361/190 |
| 4,860,152 | 8/1989 | Osborn | 361/91 |
| 4,893,211 | 1/1990 | Bynum et al. | 361/18 |
| 5,010,439 | 4/1991 | Zisa et al. | 361/91 |

OTHER PUBLICATIONS

Motorola Technical Developments, vol. 9, Aug. 1989, "High Side Driver FET Load-Dump Protection" by John Qualich, pp. 62 and 63.

Primary Examiner—Steven L. Stephan
Assistant Examiner—Dennis R. Haszko
Attorney, Agent, or Firm—Phillip H. Melamed

[57] ABSTRACT

In a circuit for overvoltage protection of a low voltage device (11) arranged to control a load (12) an energy storage capacitor (17) is connected to charge from supply (+V) while the device is controlled from a control circuit (100). During overvoltage, the controller is disconnected by switch means (15) and capacitor connected by switch means (16, 18) across the device to maintain it in an on state so that overvoltage device damage is prevented. The circuit is suited to transitory overvoltage conditions such as automotive load dump and to integration with the controlled device.

30 Claims, 1 Drawing Sheet

CIRCUIT FOR OVERVOLTAGE PROTECTION

TECHNICAL FIELD

The present invention relates semiconductor device overvoltage protection and in particular to a circuit arrangement for safeguarding a semiconductor device subject to overvoltage.

BACKGROUND OF THE INVENTION

Application of an overvoltage can lead to device destruction. A Field Effect Transistor as may for example be used as a switch in a solid relay might be rated at a maximum sustainable source-drain voltage of 50V, and would be destroyed if subjected to an overvoltage. Ways in which an overvoltage might arise are many and various. An example from an automotive application would be an event known in the art as 'load-dump'.

Load-dump can occur when an auto-engine battery becomes disconnected having previously been under charge by an alternator. Upon disconnection the alternator will be subject to a sudden loss of load and since it had previously been supply a charging current immediately prior to battery disconnection field current will be high. This condition of high field current and no or substantially reduced load leads to a sudden and potential large rise in output voltage due to transformer action. An increase to 100 volts would not be uncommon, and would be sufficient to destroy low voltage (50V) devices connected to the alternator output. The condition is further worsened if significant charging current were being supplied to a lowly charged battery. Although load dump is a relatively unlikely essentially accidental event, the potential catastrophic consequences lead to its survival being part of the specification that automotive components must meet, devices within such components must therefore be protected.

In the automotive industry there is a move to replace the use of electro-mechanical components, such as for example a relay controlling the pump of an antilock braking system, with solid state components. Field Effect Transistors are commonly used as switching elements in solid state relays for example in the well known charge pump configuration. For an application having a nominal supply voltage of 12 volts (i.e. automotive battery voltage), a solid state relay might include a Field Effect Transistor switch having an absolute maximum source-drain voltage rating of 50V. Such a Field Effect Transistor clearly would not survive load dump without protection, and lack of a suitable protection circuit has heretofore ruled out the use of such devices in automotive applications. Unfortunately, the alternative solution of providing a Field Effect Transistor capable of withstanding the voltage of several hundred volts possible during load dump is not viable since such a Field Effect Transistor would be prohibitively expensive; required silicon area (a significant cost determining factor) for a device increasing in proportion to the square of the sustainable voltage.

One solution to the load dump problem is to provide a circuit for damping the supply to all components in the event of overvoltage, and to this end it is known to form the regulator diodes associated with an automotive alternator as large zener diodes which dissipate the load dump energy. Since, however, use of this solution is by no means universal, automotive component makers cannot rely on damping and continue to face the problem of load dump overvoltage survivability. Some prior circuits use a zener diode to sense load dump and develop a turn on control signal to turn on a low voltage device during load dump. However, in such circuits, this turn on signal may not be sufficiently available throughout load dump to keep the device on.

SUMMARY OF THE INVENTION

According to the present invention there is provided a circuit arrangement for protecting a low voltage device, arranged in use to control a load, from an overvoltage condition including
an input for receiving a load control signal,
switch means for connecting said control signal to said device to control said load;
said switch means being responsive to said overvoltage condition to connect said device to a source of device on signal.

Preferably said switch means comprises two complementary switches arranged such that said control signal is connected to said load during normal operation and disconnected therefrom during overvoltage protection and said source of device on signal is disconnected from said load during normal operation and connected thereto during overvoltage protection.

Advantageously, said source of device on signal comprises energy storage means which may be connected to a supply during normal operation.

Where said device is a three terminal device an additional switch to connect said energy storage means across two terminals of said device during protection to hold said device in a preferred condition may be employed.

To advantage said energy storage means may be discharged during overvoltage protection and may determine said overvoltage protection duration.

A preferred arrangement of the present invention is that of a circuit substantially in integrated form. Advantageously, a protected device may be integrated together with the circuit of the present invention.

BRIEF DESCRIPTION OF THE DRAWINGS

In order that features and advantages of the present invention may be further appreciated, an embodiment will now be described with reference to the accompanying diagrammatic drawing, FIG. 1, which represents a protection circuit in accordance with the present invention connected to a low voltage switching device and external load (equipment).

BEST MODE FOR CARRYING OUT THE INVENTION

Figure 1:
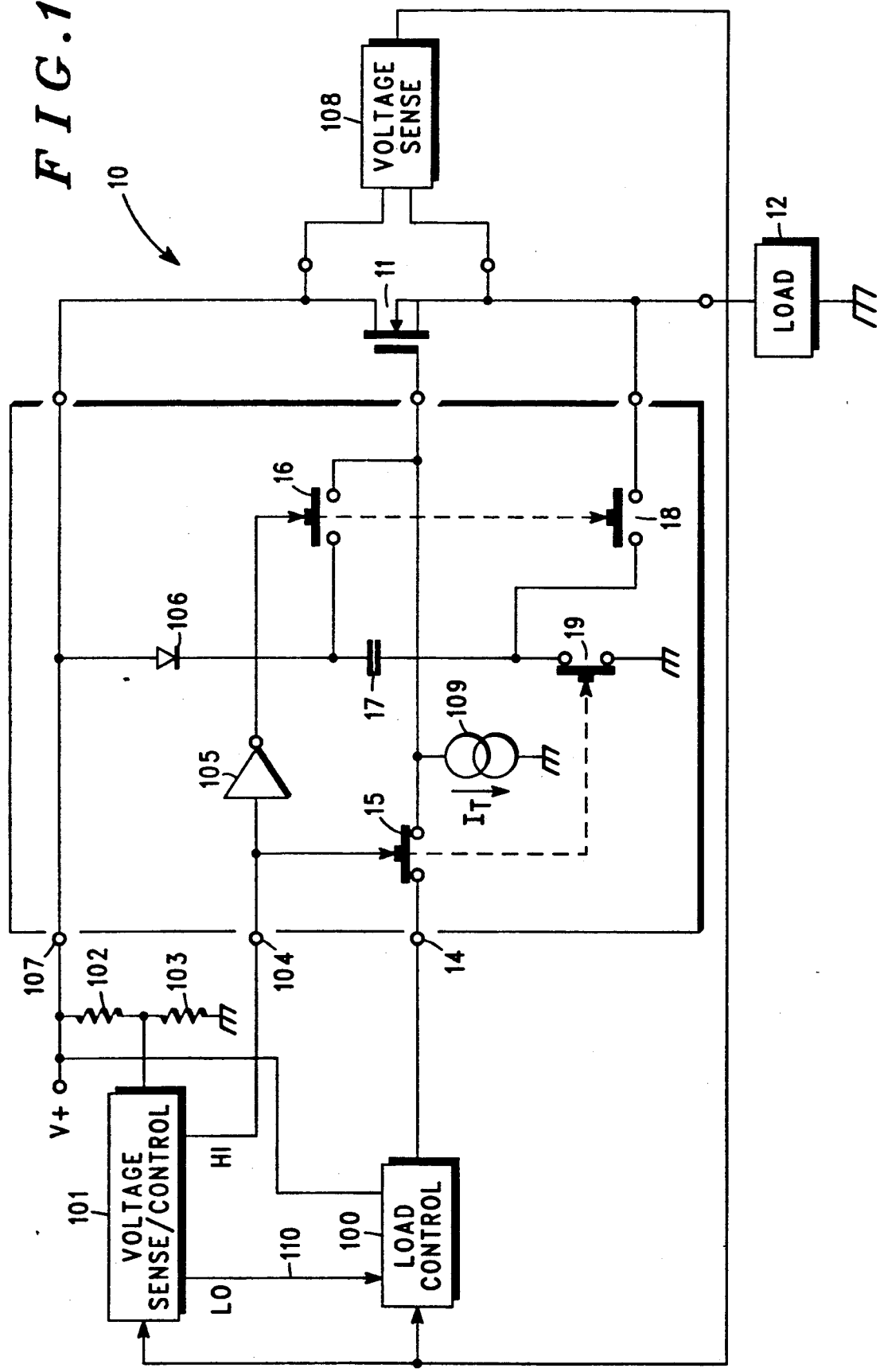

A protection circuit 10 for protecting a low voltage semiconductor device, in the form of a Field Effect Transistor switch 11, is connected to control a load 12. The circuit 10 protects the switch 11 from an overvoltage condition appearing in a supply voltage (a first power source signal) V+ provided on a supply line 107. A control signal is received at an input 14 of circuit 10. The control signal is switched to control the gate of the Field Effect Transistor switch 11 when a switch means 15 is closed and a switch means 16 is open. The control signal may for example be either an "on" signal or an "off" signal to control the load. It will be appreciated that switch means 15 and 16 considered together constitute a single pole changeover switch means. During an overvoltage condition, when the connections of switch means 15 and 16 are reversed (that is switch means 15 open and switch means 16 closed), the gate of the Field Effect Transistor switch 11 is disconnected from the input 14 and instead connected by switch means 16 to a source of "on" control signal in the form of a charged capacitor 17 which maintains bias to the gate of the Field Effect Transistor switch 11 which thus remains on during overvoltage so that a damaging cannot be developed across it. A switch means 19 (closed during normal supply) ensures that the capacitor 17 is charged during normal operation via a diode 106. A further switch 18 (closed during overvoltage) together with switch 16 ensures that the capacitor 17 is directly connected between the gate and drain of the Field Effect Transistor switch 11 during overvoltage to ensure that it is maintained in its on condition. It will be realised that switches 18 and 19 taken together constitute a single pole changeover switch means and it will be further realised that switches 15, 16, 18 and 19 taken together constitute a double pole changeover switch means.

In use, a source of load control signal (either "on" or "off") is connected to input 14. A current source 109 ($I_T$) is provided to drain any leakage current which the gate of the Field Effect Transistor switch and the load control signal may produce during the "off" state. $I_T$ is less than the current provided by the load control signal during the "on" state.

A voltage sense and switch control circuit 101 provides a control output which is received at a circuit input 104 and serves to maintain switches 15 and 19 closed during normal operation for load control and charging capacitor 17, respectively. At this time, switches 16 and 18 are maintained open and so a complementary switch drive signal is provided by an inverter 105 connected to input 104 for this purpose. It will be apparent that in alternative embodiments of the present invention switch control 101 may itself provide complementary outputs directly. The switch control 101 is made responsive to an overvoltage condition by an input from a potentiometer constituted by resistors 102 and 103 connected between the voltage supply 107 and circuit ground. Hence as described above the gate of the Field Effect Transistor switch 11 may be switched from load control 100 to capacitor 17 during an overvoltage condition to maintain the Field Effect Transistor switch 11 in its "on" condition to thereby prevent overvoltage damage.

It will be appreciated that in the embodiment of the present invention described above, capacitor 17 acts as an energy storage device which serves to maintain the Field Effect Transistor switch 11 in its on condition during overvoltage. Hence, the time for which overvoltage protection can be provided is finite, (although it may be long if the capacitor is large), since protection cannot be sustained should the capacitor become discharged. However this is not a limitation in many applications since an overvoltage condition is generally a transitory condition, an example being the load dump condition of an automotive application. The operation of the present embodiment will now be considered in such an application in more detail.

In a typical automotive application a controller 100, for example a control micro-computer, receives a plurality of sensors signals (not shown) from braking system components to produce a control signal for an anti-lock braking system. The braking system actuator comprises an electrical pump load 12, which is required to be either "on" or "off" and is controlled by a Field Effect Transistor switch 11 in response to the control signal provided by controller 100 received at input 14. The control signal at 14 is derived from the power source signal V+ which provides power to the controller 100. The power signal V+ which also provides power to the braking system, is provided by a lead-acid battery charged by an engine driven alternator (not shown). Since there are inevitable variations in supply voltage due to alternator regulation and battery condition, the supply voltage sense and switch control circuit 101 is provided to monitor supply voltage by means of a supply connected potentiometer input (resistors 102 and 103). Such a circuit for example provides an output 110 to electrically powered control circuits such as controller 100 in the event of a low supply so that controller output may be disabled under such a condition to prevent spurious control signals being generated as a result of controller malfunction during low supply; braking control reverting to the hydraulic system under such a condition only in the present case. Also present is a second voltage sensing circuit 108 connected across the source-drain of the Field Effect Transistor switch 11 providing an output to controller 100 so that the behaviour of the load-switch arrangement may be monitored for consistency with the control signals.

The alternator battery supply arrangement provides a supply which varies with load, temperature, battery condition etc. Variations might be between about 8 volts (weak battery, heavy load) and about 15 volts (overcharging battery, light load), and circuits for automotive applications are designed to be functional within at least these limits. In accordance with normal design practice, the components used are chosen so that a voltage outside these limits by a safety margin does not cause component destruction. Field Effect Transistor switch 11 for example may typically be specified to survive a drain-source voltage of 50 volts, being a voltage at least twice as great as might be generated by the supply system even during likely malfunction. Unfortunately, the alternator-battery arrangement can generate many times this voltage during the unlikely malfunction of battery disconnection or load dump. The operation of the present embodiment during a load dump cycle will now be considered.

In normal operation switches 15 and 19 are closed so that the controller 100 can control the load by driving Field Effect Transistor switch 11 as previously described and capacitor 17 charges via diode 106. Should a load dump occur the supply voltage V+ rises to exceed its normal maximum value and this behaviour is sensed by voltage sense/switch controller 101. The HI (above 28 volts, for example) condition of V+ produces a switch control signal at input 104 of the protection circuit 10 which opens switches 15 and 19 and, via inverter 105, closes switches 16 and 18. Charged capacitor 17 provides a second power source signal (the voltage across capacitor 17) which is now connected across the Field Effect Transistor to supply a turn on current, and load control 100 no longer provides the Field Effect Transistor gate signal. Since Field Effect Transistor switch 11 is held hard on, the voltage developed across it will be limited to a low value as the supply voltage rises and overvoltage damage cannot occur. Further the Field Effect Transistor switch 11 serves to discharge the load dump energy to ground via the load 12. As the energy is discharged, a very high supply voltage V+ cannot be sustained and the voltage then rapidly falls to a low value. Since there is a low voltage across Field Effect Transistor switch 11 whilst it is held on during discharge, heating damage will not be sustained even if discharge current is high.

Typically the load dump condition might exist for 150mS after which time alternator regulation (or the alternator-battery system if disconnection was transitory) restores an acceptable supply voltage and the load controller 100 again produces valid control signals. Since after load dump supply voltage typically falls below a safe level where voltage sensor 101 disables load controller 100 via its output 110, the controller 100 is preferably not used to provide a trigger to switch back to normal operation but rather a signal from voltage senor 108 (normally used to monitor switch operation) is employed.

During overvoltage when the capacitor 17 of value C and charged substantially to the normal supply voltage V+ is switched in parallel with the input capacitance of the Field Effect Transistor switch 11 (value $C_{IN}$), charge distribution will establish a new voltage based upon the new effective capacitance (C in parallel with $C_{IN}$). Since $C_{IN}$ is fixed, C is clearly chosen so that the new voltage holds Field Effect Transistor switch 11 fully on. Current generator 109 ($I_T$) gradually discharges the new effective capacitor and eventually Field Effect Transistor switch 11 can no longer be held on. As it begins to turn off, its drain-source voltage rises and this rise is sensed by sensor 108 which provides a control signal to switch controller 101 (in addition to that normally provided to load controller 100) to initiate change over switching for normal operation; that is opening switches 16 and 18 and closing switches 15 and 19. Thus, normally operation is reliably re-engaged after a substantially fixed protection period, which period can be fixed by choice of $I_T$ to be appropriate to the load cycle for the particular application. This arrangement for restoring normal operation is preferred to the alternative of using load controller 100 since risk of a spurious switch trigger output during low supply is eliminated, even though control circuit should be disable by voltage sensor 101 via output 110.

It will be appreciated that protection for a Field Effect Transistor switch 11 is provided by the circuit of the present invention with relatively few components which are suitable, with the possible exception of capacitor 17 together with the Field Effect Transistor switch 11 itself, for incorporation into an integrated circuit. Switch means 15, 16, 18 and 19 may be formed by further Field Effect Transistor switches. Voltage sense and/or control components may be integrated together with the Field Effect Transistor switch 11 and its protection circuit if desired.

It will further be realised that although the embodiment described above provides protection for a switching device, the invention is equally applicable to the protection of linear devices for example bipolar transistors, where these devices have a low voltage on state. Also, while FIG. 1 shows the use of capacitor 17 to provide a second power source signal thereacross that directly controls the gate voltage of switch 11, during load dump, such a capacitor could be used to supply operative power to a charge pump circuit or the controller 100 (instead of the signal V+) during load dump when those circuits would turn on the switch 11 during load dump. Thus lowering of V+ during load dump just due to the effect of turning on switch 11 will not result in repetitive oscillating of the switch 11 between on and off during load dump due to variations in V+, which oscillation could damage the switch 11.

For the circuit in FIG. 1 and the above described variation, the second power source signal across capacitor 17 is independent of the first power source signal V+ during load dump at least when this second signal exceeds V+.

What is claimed is:

1. A circuit arrangement for protecting a low voltage device, arranged in use to control a load, from an overvoltage condition, including
   an input for receiving a load control signal,
   a low voltage device having a control electrode and coupled across a supply voltage, said low voltage device arranged in use to control a load; and
   switch means for connecting said load control signal to said control electrode of said low voltage device to control said load;
   said switch means being responsive to an overvoltage condition in said supply voltage to disconnect said load control signal from said control electrode and connect said control electrode of said low voltage device to a source of low voltage device on signal to hold said low voltage device fully on and provide a low voltage thereacross to protect said low voltage device and provide overvoltage protection.

2. A circuit as claimed in claim 1 and wherein said switch means comprises two complementary switches arranged such that said load control signal is connected to said low voltage device control electrode during normal operation and disconnected therefrom during said overvoltage protection and said source of low voltage device on signal is disconnected from said low voltage device control electrode during normal operation and connected thereto during said overvoltage protection.

3. A circuit as claimed in claim 1 and wherein said source of device low voltage on signal comprises energy storage means.

4. A circuit as claimed in claim 3 and including further switch means to connect said energy storage means to a supply during normal operation.

5. A circuit as claimed in claim 3 wherein said low voltage device is a three terminal device and including an additional switch to connect said energy storage means across two terminals of said low voltage device, one of said terminals corresponding to said control electrode, during said overvoltage protection to hold said low voltage device in a preferred condition.

6. A circuit as claimed in claim 3 and including means to discharge said energy storage means during said overvoltage protection.

7. A circuit as claimed in claim 6 and wherein said overvoltage protection exists for a duration and wherein discharging of said energy storage means determines said overvoltage protection duration.

8. A circuit as claimed in claim 7 and wherein said duration overvoltage protection exceeds automotive load dump duration.

9. A circuit as claimed in claim 1 and wherein said device low voltage is a field effect transistor switch.

10. A circuit as claimed in claim 1 in which said switch means is substantially in integrated circuit form.

11. A circuit arrangement for protecting a low voltage device, arranged in use to control a load, from an overvoltage condition, including
    an input for receiving a load control signal derived from a first power source signal, a low voltage device having a control electrode and coupled across said first power source signal, said low voltage device arranged in use to control a load;

means for connecting said load control signal to said control electrode of said low voltage device to control said load; and switch means being responsive to an overvoltage condition in said fist power source signal to connect said control electrode of said low voltage device to a source of low voltage device on signal derived from a second power source signal different from said first power source signal to hold said low voltage device fully on and provide a low voltage thereacross to protect said low voltage device and provide overvoltage protection.

12. A circuit as claimed in claim 11 and wherein said switch means comprises two complementary switches arranged such that said load control signal is connected to said control electrode of said low voltage device during normal operation and disconnected therefrom during said overvoltage protection and said source of low voltage device on signal is disconnected from said control electrode of said low voltage device during normal operation and connected thereto during said overvoltage protection.

13. A circuit as claimed in claim 11 and wherein said source of device low voltage on signal comprises energy storage means for developing said second power source signal.

14. A circuit as claimed in claim 13 and including further switch means to connect said energy storage means to a supply providing said first power source signal during normal operation.

15. A circuit as claimed in claim 13 wherein said low voltage device is a three terminal device and including an additional switch to connect said energy storage means across two terminals of said device, one of said terminals corresponding to said control electrode, during said overvoltage protection to hold said low voltage device in a preferred condition.

16. A circuit as claimed in claim 13 and including means to discharge said energy storage means during said overvoltage protection.

17. A circuit as claimed in claim 16 and wherein said overvoltage protection exists for a duration and wherein discharging of said energy storage means determines said overvoltage protection duration.

18. A circuit as claimed in claim 17 and wherein said duration overvoltage protection exceeds automotive load dump duration.

19. A circuit as claimed in claim 11 and wherein said device low voltage is a field effect transistor switch.

20. A circuit as claimed in claim 11 wherein said second power source signal is independent of said first power source signal during load dump at least when said second power source signal exceeds said first power source signal.

21. A circuit as claimed in claim 3 wherein said energy storage device comprises a chargeable capacitor.

22. A circuit as claimed in claim 5 wherein said energy storage device comprises a chargeable capacitor.

23. A circuit as claimed in claim 6 wherein said energy storage device comprises a chargeable capacitor.

24. A circuit as claimed in claim 13 wherein said energy storage device comprises a chargeable capacitor.

25. A circuit as claimed in claim 15 wherein said energy storage device comprises a chargeable capacitor.

26. A circuit as claimed in claim 16 wherein said energy storage device comprises a chargeable capacitor.

27. A circuit as claimed in claim 7 which includes means, in response to said discharging of said energy storage device, for causing said switch means to reconnect said load control signal to said control electrode and disconnect said source of low voltage device on signal from said control electrode.

28. A circuit according to claim 27 wherein said reconnection means comprising voltage sense means which senses voltage applied across said low voltage device and implements said reconnection in response to said sensed voltage across said low voltage device exceeding a limit.

29. A circuit as claimed in claim 17 which includes means, in response to said discharging of said energy storage device, for causing said switch means to reconnect said load control signal to said control electrode and disconnect said source of low voltage device on signal from said control electrode.

30. A circuit according to claim 29 wherein said reconnection means comprises voltage sense means which senses voltage applied across said low voltage device and implements said reconnection in response to said sensed voltage across said low voltage device exceeding a limit.

* * * * *

UNITED STATES PATENT AND TRADEMARK OFFICE
CERTIFICATE OF CORRECTION

PATENT NO. : 5,130,883
DATED : 7/14/92
INVENTOR(S) : Arthur J. Edwards

It is certified that error appears in the above-identified patent and that said Letters Patent is hereby corrected as shown below:

In Column 6 line 38 please delete "device low voltage" and insert thereat -- low voltage device --.

In Column 6 line 58 please delete "duration overvoltage protection and insert thereat -- overvoltage protection duration --.

In Column 6 line 61 please delete "device low voltage" and insert thereat -- low voltage device --.

In Column 7 line 29 please delete "device low voltage" and insert thereat -- low voltage device --.

In Column 8 line 2 please delete "duration overvoltage protection and insert thereat -- overvoltage protection duration --.

In Column 8 line 5 please delete "device low voltage" and insert thereat -- low voltage device --.

Signed and Sealed this

Nineteenth Day of October, 1993

Attest:

Attesting Officer

BRUCE LEHMAN

Commissioner of Patents and Trademarks